United States Patent

Ohkawa et al.

[11] Patent Number: 5,830,570
[45] Date of Patent: Nov. 3, 1998

[54] ALUMINUM NITRIDE SUBSTRATE AND PROCESS FOR PREPARATION THEREOF

[75] Inventors: Yoshihiro Ohkawa; Makoto Ikeda; Kenichiro Miyahara; Yoshiaki Itoh, all of Kokubu, Japan

[73] Assignee: Kyocera Corporation, Kyoto, Japan

[21] Appl. No.: 597,349

[22] Filed: Feb. 6, 1996

Related U.S. Application Data

[63] Continuation of Ser. No. 631,110, Dec. 19, 1990, abandoned.

[30] Foreign Application Priority Data

Dec. 19, 1989 [JP] Japan ................................. 1-330768
Jan. 31, 1990 [JP] Japan ................................. 2-22979
Mar. 13, 1990 [JP] Japan ................................. 2-61780

[51] Int. Cl.$^6$ .................................................. L04B 41/87
[52] U.S. Cl. .................... 428/336; 428/697; 428/698; 428/701; 428/702; 264/56; 264/60; 264/61; 264/62; 427/126.3; 501/96.1; 501/98.4; 501/152; 501/153
[58] Field of Search .......................... 264/56–60, 61, 264/62; 427/126.3; 428/336, 698, 697, 701, 702, 704; 501/96.1, 98.4, 152, 153

[56] References Cited

U.S. PATENT DOCUMENTS

| | | | |
|---|---|---|---|
| 3,609,471 | 9/1971 | Scace et al. ................................. | 228/124 |
| 4,591,537 | 5/1986 | Aldinger et al. ......................... | 428/698 |
| 4,642,298 | 2/1987 | Kuramoto et al. ......................... | 501/98 |
| 4,659,611 | 4/1987 | Iwase et al. ............................. | 428/698 |
| 4,770,953 | 9/1988 | Horiguchi et al. ....................... | 428/698 |
| 4,775,596 | 10/1988 | Holleran et al. ......................... | 428/901 |
| 4,806,334 | 2/1989 | Fujinaka et al. ......................... | 428/901 |
| 4,818,626 | 4/1989 | Werdecker et al. ....................... | 428/704 |
| 4,833,108 | 5/1989 | Mizuno et al. ........................... | 501/96 |
| 4,840,853 | 6/1989 | Iio et al. ................................. | 428/698 |
| 4,843,038 | 6/1989 | Kuratani et al. ......................... | 501/98 |
| 4,847,221 | 7/1989 | Horiguchi et al. ....................... | 501/96 |
| 4,873,151 | 10/1989 | Sato et al ............................... | 428/901 |
| 4,882,212 | 11/1989 | SinghDeo et al. ....................... | 428/901 |
| 5,034,357 | 7/1991 | Yamakawa et al. ....................... | 501/98 |
| 5,077,244 | 12/1991 | Yori et al. ............................... | 501/153 |

*Primary Examiner*—Archene Turner
*Attorney, Agent, or Firm*—Loeb & Loeb LLP

[57] ABSTRACT

An aluminum nitride substrate composed of a sintered body base material composed mainly of aluminum nitride and an aluminum oxide layer formed on the surface of the base material, wherein at least one of the base material and the aluminum oxide layer contains at least one member selected from the group consisting of single substances, carbidies, nitrides, borides and oxides of Ti, V, Nb, Mo, W, Co and Ni. This aluminum oxide layer is formed by an oxidizing treatment of the base material, and a metal conductor layer is formed on this aluminum oxide layer. This substrate has a very high allusion to the metal conductor layer.

8 Claims, 1 Drawing Sheet

ALUMINUM NITRIDE SUBSTRATE AND PROCESS FOR PREPARATION THEREOF

This is a continuation of application Ser. No. 07/631,110 filed on Dec. 19, 1990, now abandoned.

BACKGROUND OF THE INVENTION (1). Field of the Invention

The present invention relates to an aluminum nitride substrate and a process for the preparation thereof. More particularly, the present invention relates to an aluminum nitride substrate, especially a blackened aluminum nitride substrate, having a metal conductor layer formed on the surface thereof, which is suitable as an electronic part such as a semiconductor element-housing package.

(2). Description of the Related Art

With recent increase of the performance and operation speed in information-processing units, the density and integration degree in semiconductor integrated circuits constituting these units have been rapidly increased. Accordingly, the electric power required for a semiconductor integrated circuit element is elevated and hence, the quantity of heat generated in the element drastically increases. Therefore, in order to drive the semiconductor integrated circuit element normally and stably, it is important to remove the heat thus generated at a high efficiency.

As the ceramic material having a high thermal conductivity, there have been proposed a beryllium oxide sintered body, a diamond body, a silicon carbide sintered body and the like as the material for overcoming the above disadvantage. However, use of the beryllium oxide sintered body is not recommended because it has a toxicity. The diamond is expensive, and the silicon carbide sintered body is defective in that the sintered body is poor in the electrically insulating property and such characteristics as the dielectric constant.

Recently, an aluminum nitride sintered body having a high thermal conductivity, a high mechanical strength, a high electrically insulating property and a thermal expansion coefficient closer to that of a silicon single crystal than alumina attracts attention in the art instead of the conventional highly heat-conductive materials.

However, this aluminum nitride sintered body is defective in that when this sintered body is used as the base material of a substrate and it is intended to form a metal conductor layer thereon, since the wettability of aluminum nitride per se with the metal is poor, the bonding strength between the base material of the substrate and the metal conductor is low.

As the means for overcoming this disadvantage, there have been proposed a method in which the aluminum nitride sintered body is heated, for example, in air, to form an aluminum oxide layer having a good wettability with the metal on the surface of the sintered body, and a method in which a glass material such as silicon oxide is coated on the surface of the aluminum nitride sintered body to form a glass layer on the surface thereof and a conductor layer is formed on the glass layer to increase the adhesion strength.

If an aluminum oxide layer is formed on the surface of an aluminum nitride sintered body in the above-mentioned manner, the adhesion strength of the conductor layer is increased over the adhesion strength attained when no aluminum oxide layer is formed. However, the adhesion strength is still lower than the practical level, and especially when a conductor layer composed mainly of gold (Au) or silver (Ag) is formed, the adhesion strength is insufficient.

Accordingly, from the viewpoint of the reliability of an electronic part comprising an aluminum nitride sintered body, development of a substrate having a conductor layer having a high adhesion strength is eagerly desired.

An aluminum nitride sintered body is generally obtained by adding a small amount of a sintering aid to an aluminum nitride powder and sintering the mixture at a high temperature in a non-oxidizing atmosphere. This aluminum nitride sintered body is semi-transparent and has a grey-to-brown hue. Accordingly, when this sintered body is applied as a substrate of a semiconductor package, in order to make the contamination caused during the handling in the preparation process inconspicuous and cut off rays and the like having bad influences on elements, it is required that this sintered body should be blackened.

SUMMARY OF THE INVENTION

It is therefore a primary object of the present invention to provide an aluminum nitride substrate having a conductor layer having an excellent adhesion strength, which comprises an aluminum nitride sintered body as a base material, and a process for the preparation of this substrate.

Another object of the present invention is to provide an aluminum nitride substrate in which a conductor layer is tightly bonded to a base material of an aluminum nitride sintered body through an aluminum oxide covering layer.

Still another object of the present invention is to provide an aluminum nitride substrate having an excellent adhesion to a conductor layer, in which an aluminum nitride sintered body is uniformly blackened without any bad influences on electric characteristics such as tan δ and electric resistance.

In accordance with the present invention, there is provided an aluminum nitride substrate comprising a sintered body base material composed mainly of aluminum nitride and an aluminum oxide layer formed on the surface of the base material, and optionally, a metal conductor layer formed on the aluminum oxide layer, wherein at least one of the base material and the aluminum oxide layer contains at least one member selected from the group consisting of single substances, carbides, nitrides, borides and oxides of Ti, V, Nb, Mo, W, Co and Ni.

Furthermore, in accordance with the present invention, there is provided a process for the preparation of an aluminum nitride substrate, which comprises subjecting a sintered body composed mainly of aluminum nitride, which contains, at least on the surface thereof, at least one member selected from the group consisting of single substances, carbides, nitrides, borides and oxides of Ti, V, Nb, Mo, W, Co and Ni, to an oxidizing heat treatment to form an aluminum oxide layer having a thickness of 0.05 to 5 μm, and, if necessary, forming a metal conductor layer on the aluminum oxide layer.

BRIEF DESCRIPTION OF THE DRAWING

The drawing is sectional view illustrating an embodiment of the aluminum nitride substrate of the present invention, in which reference numeral 1 represents an aluminum nitride sintered body base material, reference numeral 2 represents an aluminum oxide layer, reference numeral 3 represents a metal conductor layer and reference numeral 4 represents a metal or metal compound additive.

DETAILED DESCRIPTION OF THE PREFERRED EMBODIMENTS

Figure 1:
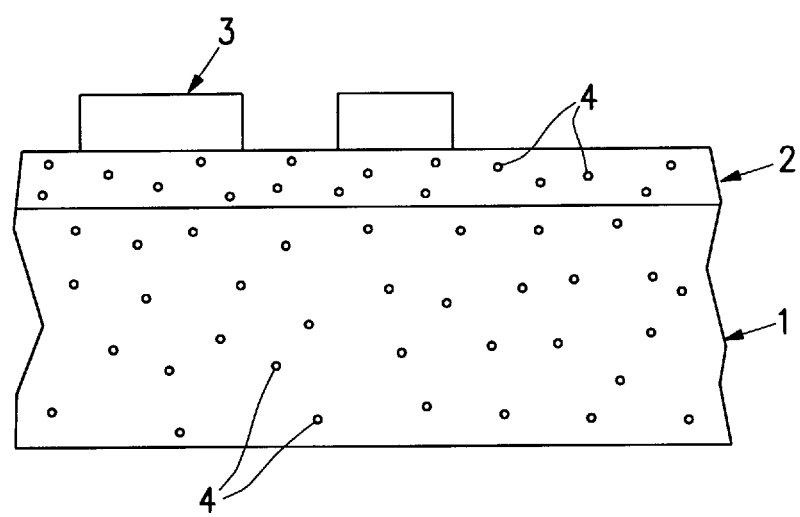

As shown in the accompanying drawing, the aluminum nitride substrate of the present invention comprises an aluminum nitride sintered body base material 1 and an aluminum oxide layer 2 formed on at least one surface of the base material 1. In this preferred embodiment, an additive 4 composed of a specific metal or metal compound is contained in both of the base material 1 and the aluminum oxide layer 2. The additive 4 may be contained only in the base material 1 or only in the aluminum oxide layer 2. A metal conductor layer 3 is formed on the surface of the aluminum oxide layer 2 and tightly bonded thereto.

Namely, the present invention is based on the finding that if at least one member selected from the group consisting of single substances, carbides, nitrides, borides and oxides of Ti, V, Nb, Mo, W, Co and Ni is incorporated into one, preferably both, of the base material 1 and the aluminum oxide layer 2, the adhesion strength between the metal conductor layer and the base material can be prominently improved. If the above-mentioned metal or metal compound is incorporated in the base material, the substrate can be uniformly blackened without substantial bad influences on the electric characteristics of the substrate.

In the aluminum nitride substrate of the present invention, the base material used is composed mainly of aluminum nitride and has a relative density of at least 95% of the theoretical density. It is preferred that the base material should have a high density and a high thermal conductivity. According to circumstances, a known sintering aid, for example, an oxide, carbide, nitride or fluoride of an alkaline earth metal such as Ca, Ba or Sr or a rare earth metal such as Y, is incorporated in an amount of up to 20% by weight. As the rare earth element (Ln), Y, Gd, Dy, Ho, Er and Yb are preferably used, and the rare earth element is preferably used in an amount of 0.1 to 15% by weight as calculated as the oxide. Preferably, an alkaline earth metal such as Ca, Sr or Ba is used in an amount of 0.005 to 3% by weight as calculated as the oxide in combination with the rare earth element.

In the present invention, it is important that at least one member selected from the group consisting of single substances, carbides, nitrides, borides and oxides of Ti, V, Nb, Mo, W, Co and Ni should be contained in the aluminum nitride sintered body. This metal or metal compound is incorporated in an amount of 0.01 to 5% by weight, and exerts the function of blackening the hue of the sintered body. Of the foregoing metals and metal compounds, metallic molybdenum and/or molybdenum carbide is especially preferably used, because blackening becomes possible without bad influences on the electric characteristics.

According to the present invention, a covering layer 15 composed mainly of aluminum oxide is formed on the surface of the aluminum nitride sintered body containing the above-mentioned metal or metal compound. This covering layer improves the chemical resistance of the substrate, and for example, the covering layer reduces the corrosion with an alkali or the like. Furthermore, when a metal conductor layer is formed on this covering layer, the adhesion strength of the metal conductor layer to the base material is improved by this covering layer.

It also is important that the covering layer should have a thickness of 0.05 to 5 μm, especially 0.2 to 4 μm. If the thickness of the covering layer is smaller than 0.05 μm, the chemical resistance of the substrate and the adhesion strength of the conductor layer to the base material become insufficient. If the thickness of the covering layer exceeds 5 μm, it is apprehended that cracking or the like will be caused because of the difference of the thermal expansion between the covering layer and the base material.

A known conductor is used for the conductor layer 3 to be formed on the covering layer. For example, metal conductors composed mainly of W, MO, Au, Ag or Mo-Mn are used, and layers of these metal conductors are formed in a thickness of 0.01 to 100 μm.

The process for the preparation of the aluminum nitride substrate of the present invention will now be described.

A sintered body composed mainly of aluminum nitride, which contains at least one member selected from the group consisting of single substances, carbides, nitrides, borides and oxides of Ti, V, Nb, Mo, W, Co and Ni, is prepared as the base material. More specifically, the above-mentioned metal or metal compound is added in an amount of 0.01 to 5% by weight to an aluminum nitride powder having an oxygen content of 0.4 to 3% by weight. If desired, in order to increase the sintering property, an oxide, carbide or nitride of an alkaline earth metal such as Ca, Ba or Sr or a rare earth metal such as Y is added as the sintering aid in an amount of 0.01 to 15% by weight. Then, the mixture is molded according to customary procedures and the molded body is fired at a temperature of 1550° to 1950° C. in a non-oxidizing atmosphere such as nitrogen or a nitrogen/hydrogen mixed atmosphere, whereby a sintered body having a relative density of at least 95% can be obtained.

Incidentally, if an oxide is selected as the above-mentioned metal or metal compound, the oxide can be converted to a metal or other metal compound by adjusting the firing conditions. For example, $TiO_2$, $V_2O_5$ and $WO_3$ can be reduced to TiN, VN and metallic W, respectively, by firing in a nitrogen/hydrogen mixed atmosphere. Furthermore, if BN or the like is present as a spread powder or the like in a firing furnace, a boride is sometimes formed.

Then, the aluminum nitride sintered body is subjected to an oxidizing treatment to convert aluminum nitride in the surface portion of the sintered body to aluminum oxide, whereby a covering layer is formed.

The formed covering layer consists essentially of $\alpha$-$Al_2O_3$, and the sintering aid or the above-mentioned metal or metal compound, contained in the sintered body, is contained in the partially oxidized state in the covering layer. This oxidizing treatment can by accomplished by heating the sintered body at a temperature of 700° to 1400° C. in the open air, or the sintered body can be partially oxidized by irradiating the sintered body with laser beams in an oxidizing atmosphere. For the reasons set forth above, the thickness of the covering layer should be adjusted to 0.05 to 5 μm by controlling the treatment time or the like.

In the case where a metal conductor layer is formed on the covering layer, according to the known thick film method, a metal paste is applied by screen printing or immersion and then baked at a temperature of 700° to 1600° C. Alternatively, the metal layer can be formed by vacuum deposition according to the thin film method. Preferably, the thickness of the metal conductor layer is 0.01 to 100 μm.

In the present invention, in the case where a blackening agent is not incorporated into the base material, an aluminum nitride layer containing a metal such as Ti or V or a compound thereof is formed only on the surface of the base material and the this layer is subjected to the same oxidizing treatment as described above. Alternatively, an aluminum oxide layer containing a metal such as Ti or V or a compound thereof is formed by the flame spraying or gas phase method. In the case where the above-mentioned metal or metal compound is contained in the base material but the above-mentioned metal or metal compound is not contained in the covering layer, an aluminum nitride layer having this structure is formed and subjected to the same oxidizing treatment as mentioned above, or a layer of aluminum oxide is formed on the surface of the base material by the flame spraying or gas phase method.

As is apparent from the foregoing detailed description, in the aluminum nitride substrate of the present invention, the adhesion strength of the metal conductor layer to the base material of the substrate can be increased without any influences on the heat conductivity and other characteristics of the aluminum nitride sintered body as the base material, and therefore, when the substrate is applied to an electronic part, the reliability is improved and the production yield can be increased. Accordingly, the application of the aluminum nitride sintered body as the substrate is greatly promoted.

The present invention will now be described in detail with reference to the following examples that by no means limit the scope of the invention.

EXAMPLE 1

Aluminum nitride having an oxygen content of 1.0% by weight, a BET specific surface area of 3.8 $m^2/g$ and a carbon content of 280 ppm was used as the starting aluminum nitride and an $Er_2O_3$ powder having a BET specific surface area of 6.0 $m^2/g$ was used as the sintering aid, and a $CaCO_3$ powder and a metal compound having an average particle size of 0.1 to 15 $\mu$m were used. These starting materials were mixed at a ratio shown in Table 1 and a binder was further added. The mixture was granulated by spray drying and press-molded under a pressure of 1 ton/$cm^2$.

The molded body was subjected to the binder-removing treatment and was fired at 1800° C. in a nitrogen gas atmosphere in a tungsten furnace for 3 hours.

The sintered body was barrel-polished and subjected to the oxidizing treatment under conditions shown in Table 1 to form an oxide film. The relative humidity of the ambient atmosphere was 30 to 80%.

An Au paste was coated on the oxide film and baked at 850° C. Then, an Au-Si foil was placed on the Au metal layer and an Ag rod having a contact area of 8.55 $mm^2$ and a diameter of 1.5 mm was placed on the Au-Si film. The assembly was maintained at a temperature of 440° C. to effect bonding.

With respect to each of the obtained samples, the composition was identified by X ray diffraction, and the thermal conductivity, dielectric constant, dielectric constant and resistivity were measured at 25° C. The Ag rod was vertically pulled and the strength at the peeling of the metal conductor layer was determined as the adhesion strength of the metal conductor layer.

In Table 1, samples 22, 23 and 24 were obtained by carrying out firing in a carbon furnace.

The obtained results are shown in Table 1.

TABLE 1

| Sample No.[1] | Starting Composition (% by weight) sintering aid | | Starting Composition (% by weight) other component | | Starting Composition (% by weight) AlN | Firing Conditions temperature (°C.) | Firing Conditions time (Hr) | Oxidizing Treatment Conditions temperature (°C.) | Oxidizing Treatment Conditions time (Hr) | Thickness (μm of oxide Film) | Crystal Phase of Base Material (except AlN and indefinite phase)[2] | Thermal Conductivity (W/mk) | Dielectric Constant (1 MHz) | Dielectric Loss × $10^{-4}$ | Resistivity (Ω-cm) | Adhesion Strength (Kg/mm²) | Hue |
|---|---|---|---|---|---|---|---|---|---|---|---|---|---|---|---|---|---|
| 1 | $Er_2O_3$ CaO | 3 0.5 | $TiO_2$ | 2 | balance | 1800 | 3 | 1100 | 1 | 0.9 | YAG, TiN, CA4 | 133 | 9.0 | 3 | $1.2 \times 10^{13}$ | 6.0 | black |
| 2 | $Er_2O_3$ CaO | 3 0.5 | $V_2O_5$ | 2 | balance | 1800 | 3 | 1100 | 1 | 0.9 | YAG, VN, CA4 | 141 | 8.9 | 3 | $2.0 \times 10^{13}$ | 7.1 | black |
| 3 | $Er_2O_3$ CaO | 3 0.5 | $Co_3O_4$ | 2 | balance | 1800 | 3 | 1100 | 1 | 0.9 | YAG, Co, CA4 | 149 | 9.2 | 3 | $2.7 \times 10^{13}$ | 6.8 | black |
| 4 | $Er_2O_3$ CaO | 3 0.5 | NiO | 2 | balance | 1800 | 3 | 1100 | 1 | 0.7 | YAG, Ni, CA4 | 154 | 9.0 | 3 | $1.0 \times 10^{13}$ | 6.7 | black |
| 5 | $Er_2O_3$ CaO | 3 0.5 | $Nb_2O_5$ | 1 | balance | 1800 | 3 | 1100 | 1 | 0.8 | YAG, NbC | 129 | 8.8 | 2 | $1.2 \times 10^{13}$ | 3.9 | black |
| 6 | $Er_2O_3$ CaO | 3 0.5 | $MoO_3$ | 0.5 | balance | 1800 | 3 | 1100 | 1 | 0.9 | YAG, Mo, CA4, CA12 | 151 | 8.6 | 2 | $9.5 \times 10^{13}$ | 8.1 | black |
| 7 | $Er_2O_3$ CaO | 3 0.5 | $WO_3$ | 0.5 | balance | 1800 | 3 | 1100 | 1 | 0.8 | YAG, W, CA4 | 156 | 8.6 | 2 | $6.6 \times 10^{13}$ | 7.1 | black |
| *8 | $Er_2O_3$ CaO | 3 0.5 | — | | balance | 1800 | 3 | 1100 | 1 | 0.9 | YAG | 169 | 8.6 | 2 | $6.6 \times 10^{13}$ | 2.2 | grey |
| *9 | $Er_2O_3$ CaO | 3 0.5 | $WO_3$ | 0.5 | balance | 1800 | 3 | — | — | — | YAG, W, CA4 | 157 | 9.0 | 2 | $6.6 \times 10^{13}$ | <0.1 | black |
| *10 | $Er_2O_3$ CaO | 3 0.5 | $MoO_3$ | 0.5 | balance | 1800 | 3 | 1000 | 0.1 | 0.04 | YAG, Mo, CA4, CA12 | 165 | 8.6 | 2 | $9.5 \times 10^{13}$ | 0.4 | black |
| 11 | $Er_2O_3$ CaO | 6 0.5 | $TiO_2$ | 1 | balance | 1800 | 3 | 1300 | 1.0 | 3.8 | YAG, TiN, CA4 | 161 | 8.8 | 2 | $2.1 \times 10^{13}$ | 8.3 | black |
| 12 | $Er_2O_3$ CaO | 6 0.5 | $V_2O_5$ | 1 | balance | 1800 | 3 | 1300 | 1.0 | 3.7 | YAG, VN, CA4 | 152 | 8.6 | 2 | $2.1 \times 10^{13}$ | 7.6 | black |
| 13 | $Er_2O_3$ CaO | 6 0.5 | $Co_3O_4$ | 1 | balance | 1800 | 3 | 1300 | 1.0 | 3.6 | YAG, Co, CA4 | 145 | 8.8 | 2 | $3.0 \times 10^{13}$ | 7.0 | black |
| 14 | $Er_2O_3$ CaO | 6 0.5 | NiO | 1 | balance | 1800 | 3 | 1300 | 1.0 | 3.9 | YAG, Ni, CA4 | 170 | 8.8 | 2 | $1.0 \times 10^{13}$ | 7.0 | black |
| 15 | $Er_2O_3$ CaO | 6 0.5 | $Nb_2O_5$ | 1 | balance | 1800 | 3 | 1300 | 1.0 | 3.9 | YAG, NbC | 163 | 8.8 | 2 | $2.3 \times 10^{13}$ | 6.4 | black |
| 16 | $Er_2O_3$ CaO | 6 0.5 | $MoO_3$ | 0.5 | balance | 1800 | 3 | 1300 | 1.0 | 4.0 | YAG, Mo, CA4, CA12 | 166 | 8.6 | 2 | $9.5 \times 10^{13}$ | 7.1 | black |
| 17 | $Er_2O_3$ CaO | 6 0.5 | $WO_3$ | 0.5 | balance | 1800 | 3 | 1300 | 1.0 | 3.9 | YAG, W, CA4 | 168 | 8.6 | 2 | $8.8 \times 10^{13}$ | 5.7 | black |
| *18 | $Er_2O_3$ CaO | 6 0.05 | — | | balance | 1800 | 3 | 1300 | 1.0 | 3.8 | YAG | 182 | 8.6 | 2 | $7.9 \times 10^{13}$ | 1.9 | grey |
| *19 | $Er_2O_3$ CaO | 6 0.05 | $TiO_2$ | 1 | balance | 1800 | 3 | 1450 | 1.5 | 9.8 | YAG, TiN, CA4, CA12 | 161 | 8.8 | 2 | $2.1 \times 10^{13}$ | <0.1 | black |
| *20 | $Er_2O_3$ CaO | 6 0.5 | $MoO_3$ | 0.5 | balance | 1800 | 3 | 1450 | 1.5 | 10.9 | YAG, Mo, CA4, CA12 | 165 | 8.6 | 2 | $9.5 \times 10^{13}$ | <0.1 | black |
| *21 | $Er_2O_3$ CaO | 6 0.05 | $WO_3$ | 0.5 | balance | 1800 | 3 | 1450 | 1.5 | 11.9 | YAG, W, CA4 | 168 | 8.6 | 2 | $8.8 \times 10^{13}$ | <0.1 | black |
| 22 | $Er_2O_3$ CaO | 3 0.5 | $TiO_2$ | 2 | balance | 1750 | 2 | 1200 | 1 | 1.4 | YAG, TiN, CA4 | 128 | 9.0 | 3 | $0.8 \times 10^{13}$ | 6.1 | black |
| 23 | $Er_2O_3$ CaO | 3 0.5 | $MoO_3$ | 2 | balance | 1750 | 2 | 1200 | 1 | 1.7 | YAG, $Mo_2C$ | 146 | 9.0 | 3 | $6.3 \times 10^{13}$ | 8.6 | black |

TABLE 1-continued

| Sample No.[1] | Starting Composition (% by weight) sintering aid | | other component | | AlN | Firing Conditions temperature (°C) | time (Hr) | Oxidizing Treatment Conditions temperature (°C) | time (Hr) | Thickness (μm of oxide Film) | Crystal Phase of Base Material (except AlN and indefinite phase)[2] | Thermal Conductivity (W/mk) | Dielectric Constant (1 MHz) | Dielectric Loss × 10⁻⁴ | Resistivity (Ω-cm) | Adhesion Strength (Kg/mm²) | Hue |
|---|---|---|---|---|---|---|---|---|---|---|---|---|---|---|---|---|---|
| 24 | CaO Er$_2$O$_3$ CaO | 0.5 3 0.5 | WO$_3$ | 2 | balance | 1750 | 2 | 1200 | 1 | 1.4 | YAG, W, W$_2$B, CA4 | 150 | 9.0 | 3 | 4.2 × 10¹³ | 9.7 | black |
| 25 | Y$_2$O$_3$ CaO | 3 0.5 | WO$_3$ | 0.5 | balance | 1800 | 3 | 1300 | 1.5 | 4.7 | YAG, W, WC CA4 | 167 | 8.6 | 2 | 3.5 × 10¹³ | 3.9 | black |
| 26 | Y$_2$O$_3$ CaO | 4 0.05 | WO$_3$ | 0.5 | balance | 1800 | 3 | 1300 | 1.5 | 4.9 | YAG, W, WC CA4 | 139 | 8.6 | 2 | 7.7 × 10¹³ | 4.2 | black |
| 27 | Y$_2$O$_3$ | 3 | MoO$_3$ | 0.5 | balance | 1800 | 3 | 1200 | 1.5 | 4.6 | YAG, Mo, CA4 | 159 | 8.6 | 2 | 3.4 × 10¹³ | 4.3 | black |
| *28 | Yb$_2$O$_3$ | 5 | — | | balance | 1750 | 2 | 1200 | 1 | 1.3 | YAG | 145 | 8.6 | 2 | 6.6 × 10¹³ | 1.3 | black |
| 29 | Yb$_2$O$_3$ | 5 | MoO$_3$ | 0.05 | balance | 1750 | 2 | 1200 | 1 | 1.3 | YAG, Mo | 143 | 8.6 | 2 | 6.6 × 10¹³ | 3.9 | black |
| 30 | Yb$_2$O$_3$ | 5 | MoO$_3$ | 5 | balance | 1750 | 2 | 1200 | 1 | 1.6 | YAG, Mo | 118 | 10.5 | 43 | 4.0 × 10¹³ | 6.0 | black |
| *31 | Yb$_2$O$_3$ | 5 | MoO$_3$ | 10 | balance | 1750 | 2 | 1200 | 1 | 1.9 | YAG, Mo | 107 | 11.1 | 51 | 1.4 × 10¹³ | 1.1 | black |
| 32 | Yb$_2$O$_3$ | 5 | MoO$_3$ | 0.05 | balance | 1750 | 2 | 1200 | 1 | 1.4 | YAG, W | 145 | 8.6 | 2 | 6.8 × 10¹³ | 4.1 | black |
| 33 | Yb$_2$O$_3$ | 5 | MoO$_3$ | 5 | balance | 1750 | 2 | 1200 | 1 | 1.5 | YAG, W | 125 | 10.2 | 25 | 4.6 × 10¹³ | 5.8 | black |
| 34 | Yb$_2$O$_3$ | 5 | MoO$_3$ | 10 | balance | 1750 | 2 | 1200 | 1 | 1.6 | YAG, W | 113 | 10.7 | 31 | 2.7 × 10¹³ | 0.8 | black |

Note
[1]*sample outside scope of present invention
[2]YAG: RE$_3$Al$_5$O$_{12}$ (RE: Yb, Er, Y) CA4: CaAl$_4$O$_7$, CA12: CaAl$_{12}$O$_{19}$ From the results shown in Table 1, the following can be seen.

Sample 9 having a conductor layer formed without performing the oxidizing treatment had an adhesion strength lower than 0.1 kg/mm$^2$ and could hardly be put into practical use. Samples 8, 12 and 28 not containing the above-mentioned metal or metal compound in the base material had a conductor layer adhesion strength of about 2.0 kg/mm$^2$ at highest, even if an oxide film was formed. In these samples, the adhesion strength was higher than that of sample 9, but the adhesion strength was still insufficient.

In contrast, each of the samples of the present invention containing the above-mentioned metal or metal compound in the base material had a high adhesion strength, but in sample 10 where the thickness of the film thickness was smaller than 0.05 μm and samples 19, 20 and 21 where the film thickness was larger than 5 μm, the adhesion strength was low.

Incidentally, in the case where the metal compound was incorporated, if the amount of the metal compound was too large, as in case of samples 31 and 34, the characteristics were degraded.

EXAMPLE 2

(a) An AlN powder having an impurity oxygen content lower than 1.2% by weight, an average particle size of 1.5 μm and a content of impurity cations excluding aluminum of less than 0.1% by weight, a sintering aid (oxide) powder having a particle size of 0.5 to 5 μm and a blackening agent powder (MoO$_3$) were mixed at a mixing ratio shown in Table 2, and the mixture was granulated and press-molded. Then, the molded body was fired at 1820° C. for 3 hours in a non-oxidizing atmosphere in a nitrogen current to obtain a test piece of a sintered body. In each sample shown in Table 2, the balance other than the sintering aid and blackening agent was AlN.

(b) With respect to each of the obtained sintered body test pieces, the blackening degree was visually evaluated and the thermal conductivity was measured by the laser flash method, and the resistivity was measured by using a disc. Furthermore, the crystal phase of the additive was identified by the XRD method. The obtained results are shown together with the composition in Table 2.

TABLE 2

| Sample No. | Kind and Composition (% by weight) of Sintering Aid | | | | Kind and Composition (% by weight) of Blackening Agent | Blackening Degree | Thermal Conductivity (W/mk) | Resistivity (Ω · cm) at Room Temperature | Crystal Phase of Additive (by XRD) |
|---|---|---|---|---|---|---|---|---|---|
| | alkaline earth metal oxide | | rare earth element oxide | | | | | | |
| 1 | CaO | 0.03 | Y$_2$O$_3$ | 6.0 | MoO$_3$ 0.5 | black | 181 | 10$^{13}$ | Mo, Mo$_2$C, YAlO$_3$, Y$_4$Al$_2$O$_9$ |
| 2 | — | — | Gd$_2$O$_3$ | 7.0 | MoO$_3$ 0.5 | black | 168 | 10$^{13}$ | Mo, Mo$_2$C, GdAlO$_3$ |
| 3 | — | — | Gd$_2$O$_3$ | 2.0 | MoO$_3$ 0.5 | black | 122 | 10$^{13}$ | Mo, Mo$_2$C, Gd$_5$Al$_3$O$_{12}$ |
| 4 | BaO | 0.5 | Dy$_2$O$_3$ | 0.3 | MoO$_3$ 0.5 | black | 109 | 10$^{13}$ | Mo, Mo$_2$C, BaAl$_{12}$O$_{19}$, Dy$_5$Al$_3$O$_{12}$ |
| 5 | CaO | 0.5 | Dy$_2$O$_3$ | 4.0 | MoO$_3$ 0.5 | black | 148 | 10$^{13}$ | Mo, Mo$_2$C, CaAl$_4$O$_7$, Dy$_5$Al$_3$O$_{12}$ |
| 6 | — | — | Dy$_2$O$_3$ | 7.0 | MoO$_3$ 0.5 | black | 163 | 10$^{13}$ | Mo, Mo$_2$C, DyAlO$_3$ |
| 7 | — | — | Ho$_2$O$_3$ | 3.0 | MoO$_3$ 0.5 | black | 133 | 10$^{13}$ | Mo, Mo$_2$C, Ho$_5$Al$_3$O$_{12}$ |
| 8 | — | — | Ho$_2$O$_3$ | 6.0 | MoO$_3$ 0.5 | black | 166 | 10$^{13}$ | Mo, Mo$_2$C, HoAlO$_3$ |
| 9 | — | — | Ho$_2$O$_3$ | 9.0 | MoO$_3$ 0.5 | black | 193 | 10$^{13}$ | Mo, Mo$_2$C, HoAlO$_3$, Ho$_4$Al$_2$O$_9$ |
| 10 | CaO | 0.04 | Ho$_2$O$_3$ | 5.0 | MoO$_3$ 0.5 | black | 160 | 10$^{13}$ | Mo, Mo$_2$C, HoAlO$_3$, Ho$_5$Al$_3$O$_{12}$ |
| 11 | — | — | Er$_2$O$_3$ | 1.0 | MoO$_3$ 0.5 | black | 111 | 10$^{13}$ | Mo, Mo$_2$C, Er$_5$Al$_3$O$_{12}$ |
| 12 | CaO | 0.1 | Er$_2$O$_3$ | 5.0 | MoO$_3$ 0.5 | black | 150 | 10$^{13}$ | Mo, Mo$_2$C, Er$_5$Al$_3$O$_{12}$, ErAlO$_3$ |
| 13 | — | — | Er$_2$O$_3$ | 9.0 | MoO$_3$ 0.5 | black | 193 | 10$^{13}$ | Mo, Mo$_2$C, Er$_5$Al$_2$O$_9$, ErAlO$_3$ |
| 14 | SrO | 2.0 | Yb$_2$O$_3$ | 0.5 | MoO$_3$ 0.5 | black | 107 | 10$^{13}$ | Mo, Mo$_2$C, SrAl$_2$O$_4$, SrAl$_4$O$_7$ |
| 15 | — | — | Yb$_2$O$_3$ | 6.0 | MoO$_3$ 0.5 | black | 158 | 10$^{13}$ | Mo. Mo$_2$C, YbAlO$_3$ |
| 16 | — | — | Ho$_2$O$_3$ | 8.0 | MoO$_3$ 0.05 | black | 184 | 10$^{13}$ | Mo. Mo$_2$C, HoAlO$_3$, Ho$_4$Al$_2$O$_9$ |
| 17 | — | — | Ho$_2$O$_3$ | 8.0 | MoO$_3$ 0.2 | black | 182 | 10$^{13}$ | Mo$_2$C, HoAlO$_3$, Ho$_4$Al$_2$O$_9$ |
| 18 | — | — | Ho$_2$O$_3$ | 8.0 | MoO$_3$ 1.0 | black | 170 | 10$^{13}$ | Mo, Mo$_2$C, HoAlO$_3$, Ho$_4$Al$_2$O$_9$ |
| 19 | — | — | Ho$_2$O$_3$ | 8.0 | MoO$_3$ 2.0 | black | 148 | 10$^{13}$ | Mo, Mo$_2$C, HoAlO$_3$, Ho$_4$Al$_2$O$_9$ |
| 20 | — | — | Ho$_2$O$_3$ | 8.0 | MoO$_3$ 4.0 | black | 122 | 10$^{13}$ | Mo, HoAlO$_3$, Ho$_4$Al$_2$O$_9$ |
| *21 | — | — | Y$_2$O$_3$ | 4.0 | MoO$_3$ 0.005 | greyishwhite | 151 | 10$^{13}$ | Y$_5$Al$_3$O$_{12}$, YAlO$_3$ |
| *22 | — | — | Y$_2$O$_3$ | 4.0 | MoO$_3$ 6.0 | black | 96 | 10$^{13}$ | Mo, Y$_5$Al$_3$O$_{12}$, YAlO$_3$ |
| *23 | — | — | Yb$_2$O$_3$ | 0.05 | MoO$_3$ 0.5 | black | 79 | 10$^{13}$ | Mo, Mo$_2$C (unsintered) |
| *24 | — | — | Gb$_2$O$_3$ | 19.0 | MoO$_3$ 0.5 | black | 88 | 10$^{13}$ | Mo, Mo$_2$C, Gd$_2$O$_3$, Gd$_4$Al$_2$O$_9$ |
| *25 | CaO | 0.003 | — | — | MoO$_3$ 0.5 | greyishwhite | 34 | 10$^{13}$ | Mo (unsintered) |
| *26 | CaO | 4.0 | — | — | MoO$_3$ 0.5 | black | 88 | 10$^{13}$ | Mo$_2$C, CaAl$_2$O$_3$, Ca$_2$Al$_2$O$_5$ |
| *27 | SrO | 0.5 | Dy$_2$O$_3$ | 4.0 | Ta$_2$O$_3$ 0.5 | greyishblack | 139 | 10$^{13}$ | TaC, SrAl$_4$O$_7$, Dy$_5$Al$_3$O$_{12}$ |
| *28 | CaO | 1.0 | Y$_2$O$_3$ | 3.0 | ZrO$_2$ 0.5 | gold | 138 | 10$^{13}$ | ZrN, CaAl$_4$O$_7$, Y$_5$Al$_3$O$_{12}$ |

Note:
*outside scope of present invention

From the results shown in Table 2, the following can be seen.

Each of samples 1 through 20 had a good blackening degree, was excellent in the thermal conductivity and had a resistivity suitable for a substrate of a semiconductor package. In contrast, in sample 21, since the amount of the blackening agent was small, the blackening degree was insufficient. In sample 22, since the amount of the blackening agent was too large, the thermal conductivity and resistivity were reduced. In samples 23 and 25, since the amount of the sintering aid was small, the molded body was not sintered, and the thermal conductivity was drastically reduced. In contrast, in samples 24 and 26, since the amount of the sintering aid was too large, the thermal conductivity was reduced. In samples 27 and 28, since the blackening agent used was other than metallic molybdenum and molybdenum carbide, no sufficient blackening degree was obtained.

We claim:
1. An aluminum nitride substrate comprising a sintered body base material comprising aluminum nitride, an alumi- num oxide layer formed on the surface of the base material, and a metal conductor layer formed on the aluminum oxide layer, wherein said base material is composed of a sintered body comprising aluminum nitride, a sintering aid containing at least one rare earth element and 0.01 to 5% by weight of at least one member selected from the group consisting of an elemental form, carbides, nitrides, borides and oxides of Ti, V, Nb, Mo, W and Co as blackening agent, and having a relative density of at least 95% of the theoretical density, said aluminum oxide layer is formed by oxidation of said base material and has a thickness of 0.05 to 5 μm and said substrate is uniformly blackened.

2. An aluminum nitride substrate according to claim 1, wherein the blackening agent is a carbide, a nitride, a boride or an oxide of an element selected from the group consisting of Ti, V, Nb and Co.

3. A process for the preparation of a black aluminum nitride substrate, which comprises molding a mixture comprising an aluminum nitride powder, 0.01 to 15% by weight of a sintering aid containing at least one rare earth element and 0.01 to 5% by weight of at least one member selected from the group consisting of an elemental form, carbides, nitrides, borides, and oxides of Ti, V, Nb, Mo., W and Co as blackening agent, into a molded body, sintering the molded body in a non-oxidizing atmosphere to form a sintered body having a relative density of at least 95% of the theoretical density, subjecting the sintered body to an oxidizing heat treatment to form an aluminum oxide layer containing the sintering aid and the blackening agent and having a thickness of 0.05 to 5 μm on the surface thereof, and applying a metal paste on the aluminum oxide layer, and baking the metal paste at a temperature of 700° to 1600° C. to form a metal conductor layer on the aluminum oxide layer.

4. A process according to claim 3, wherein the aluminum nitride powder has an oxygen content of 0.4 to 3% by weight.

5. A process according to claim 3, wherein the sintering aid is at least one member selected from the group consisting of oxides, carbides and nitrides of alkaline earth metals and rare earth elements.

6. A process according to claim 3, wherein sintering is conducted at a temperature of 1550° to 1950° C.

7. A process according to claim 3, wherein the oxidizing heat treatment is conducted at a temperature of 700° to 1400° C.

8. A process according to claim 3, wherein the blackening agent is a carbide, a nitride, a boride or an oxide of an element selected from the group consisting of Ti, V, Nb and Co.

* * * * *